US012695429B2

(12) United States Patent
Bien et al.

(10) Patent No.: US 12,695,429 B2
(45) Date of Patent: Jul. 28, 2026

(54) AMPLIFIER WITH CASCODE ARRANGEMENT

(71) Applicant: NXP USA, Inc., Austin, TX (US)

(72) Inventors: David Edward Bien, Glendale, AZ (US); Xu Jason Ma, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 584 days.

(21) Appl. No.: 18/309,558

(22) Filed: Apr. 28, 2023

(65) Prior Publication Data

US 2024/0364277 A1 Oct. 31, 2024

(51) Int. Cl.
*H03F 1/52* (2006.01)
*H03F 3/04* (2006.01)

(52) U.S. Cl.
CPC ................. *H03F 1/52* (2013.01); *H03F 3/04* (2013.01); *H03F 2200/426* (2013.01)

(58) Field of Classification Search
CPC ........ H03F 1/52; H03F 3/04; H03F 2200/426; H03F 2203/45352; H03F 3/45286
USPC ......................................... 330/252–261, 311
See application file for complete search history.

(56) References Cited

U.S. PATENT DOCUMENTS 7,145,370 B2    12/2006  Bernard et al.
7,429,873 B2     9/2008  Peschke
7,786,807 B1 *   8/2010  Li ......................... H03F 1/0244
                                                          330/311

10,389,306 B2 *  8/2019  Wagh .................... H03F 1/0211
11,863,127 B2 *  1/2024  Chang .................... H03F 1/223
2015/0270806 A1  9/2015  Wagh et al.
2018/0083578 A1 *  3/2018  Klaren ................... H03F 3/213

FOREIGN PATENT DOCUMENTS

CN        111030608  A      4/2020
CN        210693865  U      6/2020

OTHER PUBLICATIONS

Mandegaran, Sam et al; "A Breakdown Voltage Multiplier for High Voltage Swing Drivers"; IEEE J. of Solid-State Circuits, vol. 42, No. 2; 11 pages (Feb. 2007).
Pashmineh, Sara et al; "A High-Voltage Driver Based on Stacked Low-Voltage Transistors with Minimized On-Resistance for a Buck Converter in 65 nm CMOS"; IEEE Canadian Conference on Electrical and Computer Engineering; 5 pages (2016).

(Continued)

*Primary Examiner* — Hieu P Nguyen
(74) *Attorney, Agent, or Firm* — Andrew C. Milhollin

(57) ABSTRACT

An amplifier device, such as an operational amplifier device or unity gain buffer, may include a first input terminal, an inverting input terminal, a non-inverting input terminal, a reference voltage supply terminal, a negative voltage supply terminal, and an output terminal. The amplifier device may include one or more cascode arrangements, such as a first cascode arrangement coupled between the negative voltage supply terminal and the output terminal. A first transistor of the first cascode stage may be configured to receive a variable bias voltage at its gate terminal. A second transistor of the first cascode stage may be configured to receive a fixed bias voltage at its gate terminal. The variable bias voltage may correspond to a first input voltage supplied at the first input terminal.

18 Claims, 3 Drawing Sheets

(56) References Cited

OTHER PUBLICATIONS

Pashmineh, Sara et al; "Design of high speed high-voltage drivers based on stacked standard CMOS for various supply voltages"; IEEE 56th Int'l Midwest Symposium on Circuits and Systems; 4 pages (2013).

* cited by examiner

AMPLIFIER WITH CASCODE ARRANGEMENT

TECHNICAL FIELD

Embodiments of the subject matter described herein relate generally to amplifiers, including operational amplifiers having one or more cascode stages.

BACKGROUND

Semiconductor devices find application in a wide variety of electronic components and systems. For example, semiconductor transistor-based amplifier devices are commonly used to amplify power, current, or voltage of signals provided at one or more inputs of such amplifier devices. A unity gain buffer, sometimes referred to as a "buffer amplifier" or "buffer" is a type of amplifier device that provides a voltage gain or current gain of exactly or approximately 1 between its input and its output. Transistors used to implement such amplifier devices typically have defined voltage limits. If such voltage limits are exceeded, the corresponding transistor may be damaged, which may negatively impact the operability of the corresponding amplifier device.

SUMMARY

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, an amplifier device includes a first input terminal, a first voltage supply terminal, an output terminal, and a first cascode arrangement. The first input terminal may be configured to receive a first input voltage. The output terminal may be configured to provide an output voltage. The first cascode arrangement may be electrically coupled between the first voltage supply terminal and the output terminal. The first cascode arrangement may include a first transistor and a second transistor. The first transistor may have a first drain terminal electrically coupled to the output terminal, a first source terminal electrically coupled to the first drain terminal, and a first gate terminal that is configured to receive a variable bias voltage and to control the flow of current from the first drain terminal to the first source terminal, where the variable bias voltage corresponds to the first input voltage. The second transistor may have a second drain terminal electrically coupled to the first source terminal of the first transistor, a second source terminal electrically coupled to the first voltage supply terminal and to the second drain terminal, and a second gate terminal that is configured to receive a fixed bias voltage and to control the flow of current from the second drain terminal to the second source terminal.

In one or more embodiments, the amplifier device includes a current supply terminal configured to receive an input current, a node coupled to the second gate terminal of the second transistor, and a resistance coupled between the current supply terminal and the node. The second gate terminal of the second transistor may be configured to receive the fixed bias voltage via the node.

In one or more embodiments, the amplifier device includes a second voltage supply terminal and a voltage divider coupled between the first voltage supply terminal and the second voltage supply terminal. The second gate terminal of the second transistor may be configured to receive the fixed bias voltage via a node of the voltage divider.

In one or more embodiments, the amplifier device includes a second voltage supply terminal, a first bipolar junction transistor (BJT) having a first emitter terminal coupled to the second voltage supply terminal, a first collector terminal coupled to the output terminal, and a first base terminal, a second BJT having a second emitter terminal coupled to the second voltage supply terminal, a second collector terminal, and a second base terminal coupled to the first base terminal of the first BJT, and a second cascode arrangement coupled between the second collector terminal of the second BJT and the first voltage supply terminal. The second cascode arrangement may be configured to receive at least the fixed bias voltage.

In one or more embodiments, the amplifier device includes a non-inverting input terminal configured to receive a second input voltage, a third BJT having a third emitter terminal, a third collector terminal coupled to a first bias node, and a third base terminal coupled to the non-inverting input terminal, and a third cascode arrangement coupled between the third emitter terminal of the third BJT and the first voltage supply terminal. The third cascode arrangement may be configured to receive at least the fixed bias voltage and the variable bias voltage.

In one or more embodiments, the amplifier device includes an inverting input terminal configured to receive a third input voltage, a fourth BJT having a fourth emitter terminal, a fourth collector terminal coupled to the first bias node, and a fourth base terminal coupled to the inverting input terminal, and a fourth cascode arrangement coupled between the fourth emitter terminal of the fourth BJT and the first voltage supply terminal. The fourth cascode arrangement may be configured to receive at least the fixed bias voltage and the variable bias voltage.

In one or more embodiments, the amplifier device includes a third transistor having a third drain terminal electrically coupled to the first bias node, a third source terminal electrically coupled to the third drain terminal, and a third gate terminal that is coupled to the first input terminal, and a fifth cascode arrangement coupled between the third source terminal of the third transistor and the first voltage supply terminal. The fifth cascode arrangement may be configured to receive at least the fixed bias voltage and the variable bias voltage.

In one or more embodiments, the first input voltage, the third input voltage, and the output voltage are each within 10% of the second input voltage.

In one or more embodiments, the second voltage supply terminal is configured to receive a first voltage, the first voltage supply terminal is configured to receive a second voltage, and the first voltage is at least 8 volts higher than the second voltage.

In one or more embodiments, the first input voltage, the second input voltage, and the third input voltage, are each greater than the second voltage and less than the first voltage.

In one or more embodiments, the first input voltage is configured to track the second input voltage with an offset of between 0 volts to 2 volts.

In an example embodiment, a unity gain buffer includes a first input terminal, a non-inverting input terminal, a first voltage supply terminal, an output terminal, and a first cascode arrangement. The first input terminal may be configured to receive a first input voltage. The non-inverting input terminal may be configured to receive a second input voltage. The first input voltage may track the second input voltage. The first voltage supply terminal may be configured to receive a first supply voltage. The output terminal may be configured to provide an output voltage. The first cascode arrangement may be electrically coupled between the first voltage supply terminal and the output terminal. The first cascode arrangement may include a first transistor and a second transistor. The first transistor may be coupled to the output terminal and having a first gate terminal that is configured to receive a variable bias voltage. The variable bias voltage may correspond to the first input voltage. The second transistor may be coupled between the first transistor and the first voltage supply terminal and having a second gate terminal that is configured to receive a fixed bias voltage. The first transistor may be configured to prevent a voltage differential across the second transistor from exceeding a predefined voltage threshold.

In one or more embodiments, the unity gain buffer includes a current supply terminal configured to receive an input current, a node coupled to the second gate terminal of the second transistor, and resistance coupled between the current supply terminal and the node. The second gate terminal of the second transistor may be configured to receive the fixed bias voltage via the node.

In one or more embodiments, the unity gain buffer includes a second voltage supply terminal configured to receive a second supply voltage that is greater than the first supply voltage, and a voltage divider coupled between the first voltage supply terminal and the second voltage supply terminal. The second gate terminal of the second transistor may be configured to receive the fixed bias voltage via a node of the voltage divider.

In one or more embodiments, the unity gain buffer includes a second voltage supply terminal configured to receive a second supply voltage that is greater than the first supply voltage, a first bipolar junction transistor (BJT) having a first emitter terminal coupled to the second voltage supply terminal, a first collector terminal coupled to the output terminal, and a first base terminal, a second BJT having a second emitter terminal coupled to the second voltage supply terminal, a second collector terminal, and a second base terminal coupled to the first base terminal of the first BJT, and a second cascode arrangement coupled between the second collector terminal of the second BJT and the first voltage supply terminal. The second cascode arrangement may be configured to receive at least the fixed bias voltage.

In one or more embodiments, the unity gain buffer includes a third BJT having a third emitter terminal, a third collector terminal coupled to a first bias node, and a third base terminal coupled to the non-inverting input terminal, and a third cascode arrangement coupled between the third emitter terminal of the third BJT and the first voltage supply terminal. The third cascode arrangement may be configured to receive at least the fixed bias voltage and the variable bias voltage.

In one or more embodiments, the unity gain buffer includes a third BJT having a third emitter terminal, a third collector terminal coupled to a first bias node, and a third base terminal coupled to the non-inverting input terminal, and a third cascode arrangement coupled between the third emitter terminal of the third BJT and the first voltage supply terminal. The third cascode arrangement may be configured to receive at least the fixed bias voltage and the variable bias voltage.

In one or more embodiments, the unity gain buffer includes an inverting input terminal configured to receive a third input voltage, a fourth BJT having a fourth emitter terminal, a fourth collector terminal coupled to the first bias node, and a fourth base terminal coupled to the inverting input terminal, and a fourth cascode arrangement coupled between the fourth emitter terminal of the fourth BJT and the first voltage supply terminal. The fourth cascode arrangement may be configured to receive at least the fixed bias voltage and the variable bias voltage.

In one or more embodiments, the unity gain buffer includes a third transistor coupled to the first bias node and having a third gate terminal that is coupled to the first input terminal, and a fifth cascode arrangement coupled between the third transistor and the first voltage supply terminal. The fifth cascode arrangement may be configured to receive at least the fixed bias voltage and the variable bias voltage.

In one or more embodiments, the first input voltage is configured to track the second input voltage with an offset of between 0 volts to 2 volts.

In an example embodiment, control circuitry includes an amplifier transistor, a reference transistor, a switch, and a unity gain buffer. The amplifier transistor may be configured to receive an RF input signal for amplification. The amplifier transistor and the reference transistor may be formed on the same semiconductor die. The switch may have an output coupled to a control terminal of the amplifier transistor. The unity gain buffer may include an input terminal, a non-inverting input terminal, a voltage supply terminal, an output terminal, and a cascode arrangement. The input terminal may be configured to receive a first input voltage. The non-inverting input terminal may be coupled to the reference transistor and configured to receive a second input voltage. The first input voltage may track the second input voltage. The voltage supply terminal may be configured to receive a supply voltage. The output terminal may be configured to provide an output voltage to the control terminal of the amplifier transistor via the switch. The cascode arrangement may be electrically coupled between the voltage supply terminal and the output terminal. The cascode arrangement may include a first transistor and a second transistor. The first transistor may be coupled to the output terminal and having a first gate terminal that is configured to receive a variable bias voltage. The variable bias voltage may correspond to the first input voltage. The second transistor may be coupled between the first transistor and the voltage supply terminal and having a second gate terminal that is configured to receive a fixed bias voltage. The first transistor may be configured to prevent a voltage differential across the second transistor from exceeding a predefined voltage threshold.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein:

DETAILED DESCRIPTION

Figure 1:
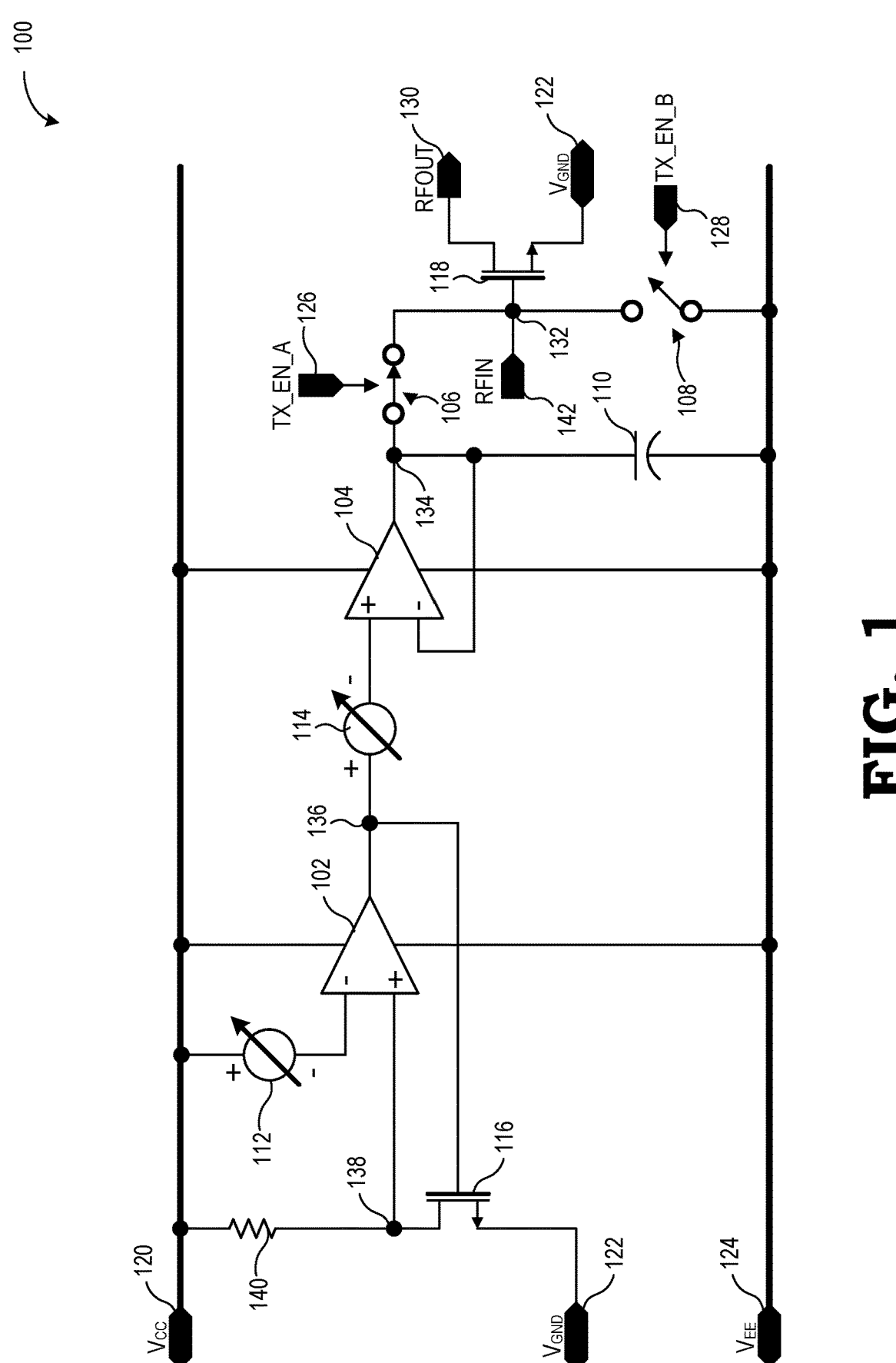
FIG. 1 is a block diagram of example transistor gate control circuitry, in accordance with various embodiments.

The following detailed description is merely illustrative in nature and is not intended to limit the embodiments of the subject matter or the application and uses of such embodiments. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose. As used herein, the words "exemplary" and "example" mean "serving as an example, instance, or illustration." Any implementation described herein as exemplary or an example is not necessarily to be construed as preferred or advantageous over other implementations.

Directional references such as "top," "bottom," "left," "right," "above," "below," and so forth, unless otherwise stated, are not intended to require any preferred orientation and are made with reference to the orientation of the corresponding figure or figures for purposes of illustration.

For the sake of brevity, conventional semiconductor fabrication techniques may not be described in detail herein. In addition, certain terms may also be used herein for reference only, and thus are not intended to be limiting. For instance, the terms "first", "second", and other such numerical terms referring to structures do not imply a sequence or order unless clearly indicated by the context.

Various embodiments described herein relate to a semiconductor transistor-based amplifier device (i.e., "amplifier") that includes a cascode arrangement configured to prevent or mitigate conditions in which one or more voltage limits of one or more transistors of the amplifier are exceeded. In one or more embodiments, the amplifier device may be an operational amplifier that is configurable as a unity gain buffer (e.g., having a voltage gain of around 1; having a voltage gain of around 0 dB). For a given amplifier, if the voltage difference between any two input terminals, output terminals, or supply terminals of the amplifier exceeds the inter-terminal voltage limits of one or more transistors of the amplifier, such transistors could be damaged. To address this problem, in one or more embodiments, an amplifier includes one or more cascode arrangements in which respective sets series-connected transistors (i.e., transistors that are coupled together source-to-drain along a single path) are coupled between terminals of the amplifier, where respective voltage differentials between such terminals may exceed one or more inter-terminal voltage limits of a single transistor of the series-connected transistors. In one or more embodiments, each of the series-connected transistors may be metal oxide semiconductor (MOS) transistors. Gate terminals of the transistors of these cascode arrangements may be coupled to respective control nodes configured to bias the gate terminals to respective cascode bias voltages. The cascode bias voltages at the control nodes may be set such that the voltage between terminals of any given transistor of the amplifier may be reduced to be within corresponding voltage limits of that transistor, including gate-to-source voltage ($V_{GS}$), drain-to-source voltage ($V_{DS}$), and the gate-to-drain voltage ($V_{GD}$) voltage limits. Thus, by including such cascode arrangements in an amplifier, such as an operational amplifier, the likelihood of transistors of the amplifier being damaged due to over-voltage may be advantageously reduced. At least one of the cascode bias voltages may be a variable cascode bias voltage corresponding to a tracking voltage. The tracking voltage may be equal to a non-inverting input voltage of the amplifier device or offset from the non-inverting input voltage by a fixed amount (e.g., between around 0 V to around 2 V), in accordance with various embodiments. The tracking voltage may be equal to an output voltage of the amplifier device or offset from the output voltage by a fixed amount (e.g., between around 0 V to around 2 V), in accordance with various embodiments.

In one or more embodiments, the amplifier device includes a first cascode arrangement coupled between an output terminal of the amplifier device and a negative voltage supply terminal of the amplifier device. The first cascode arrangement may include two or more series-connected nMOS transistors (three, as a non-limiting example) where at least one of the series-connected nMOS transistors receives a variable bias voltage corresponding to the tracking voltage and at least one other of the series-connected nMOS transistors receives a fixed bias voltage (e.g., from a node of a voltage divider, as a non-limiting example).

In one or more embodiments, the amplifier device includes a one or more other cascode arrangements in addition to the first cascode arrangement, where each such cascode arrangement is coupled between the negative voltage supply terminal of the amplifier device and one or more other terminals or nodes of the amplifier device (e.g., a reference voltage supply terminal, a positive voltage supply terminal, a non-inverting input terminal, an inverting input terminal, and/or the like). Each cascode arrangement may be configured to protect one or more transistors or other devices of the amplifier device by limiting the voltage provided to such devices (e.g., provided to the drain terminals of such devices), thereby preventing corresponding inter-terminal voltage limits of such devices from being exceeded. Each cascode arrangement may be configured to receive at least one fixed bias voltage. At least a subset of the cascode arrangements may be configured to receive (e.g., in addition to the fixed bias voltage) a variable bias voltage corresponding to the tracking voltage.

FIG. 1 is a block diagram of control circuitry 100 that is configured to selectively provide a direct current (DC) bias to a gate terminal of an amplifier transistor 118. As shown, the control circuitry 100 may include a sense amplifier 102, an operational amplifier 104, a first switch 106, a second switch 108, a capacitor 110, a first digital-to-analog convertor (DAC) 112, a second DAC 114, and a sense resistor 140. The control circuitry 100 may be configured to control a reference transistor 116 and the amplifier transistor 118. For example, the control circuitry 100 may be configured as bias circuitry that selectively provides a direct current (DC) bias voltage to the gate of the amplifier transistor 118 based, at least in part, on a voltage detected by the sense amplifier 102 at a drain terminal of the reference transistor 116. As will be described, various elements of the control circuitry 100 may be coupled to one or more of a positive voltage supply 120 configured to supply a positive voltage $V_{CC}$, a negative voltage supply 124 configured to supply a negative voltage $V_{EE}$, (sometimes referred to herein as a "supply voltage" $V_{EE}$) one or more reference voltage supplies 122 configured to provide a reference voltage $V_{GND}$, a first control signal source 126 configured to supply a variable control signal TX_EN_A, or a second control signal source 128 configured to supply a variable control signal TX_EN_B. In one or more embodiments, each reference voltage supply 122 corresponds to a ground node and the reference voltage $V_{GND}$ is at or around 0 V. It should be understood that "ground nodes" herein may not necessarily correspond to "earth ground" but may instead correspond to "signal ground" or another suitable reference potential, in accordance with various embodiments. Herein, the "gate terminal" or "base terminal" of a transistor may sometimes be referred to as a "control terminal", and the "drain terminal" and "source terminal" or "emitter terminal" and "collector terminal" of a transistor may sometimes be referred to as "current-carrying terminals."

The sense amplifier 102 may be an operational amplifier having a positive voltage supply terminal coupled directly to the positive voltage supply 120, a negative voltage supply terminal coupled directly to the negative voltage supply 124, an inverting input coupled to an output of the first DAC 112, a non-inverting input coupled to a node 138 disposed between the sense resistor 140 and the drain of the reference transistor 116, and an output coupled to a node 136 that is coupled to an input of the second DAC 114 and the gate of the reference transistor 116. In or more embodiments, the voltage $V_{CC}$ supplied by the positive voltage supply 120 may be around 5 V. In one or more embodiments, the voltage $V_{EE}$ supplied by the negative voltage supply 124 may be around −8 V.

The operational amplifier 104 may be configured as a unity gain buffer (sometimes referred to as a "voltage buffer") with a gain of 1 or around 1 (e.g., a gain of 0 dB or around 0 dB). That is, the operational amplifier 104 may be configured such that the voltage at the non-inverting input of the operational amplifier 104 may be equal to or approximately equal to the voltage at the output of the operational amplifier 104. The operational amplifier 104 may include a positive voltage supply terminal coupled directly to the positive voltage supply 120, a negative voltage supply terminal coupled directly to the negative voltage supply 124, a non-inverting input coupled to the output of the second DAC 114, an output coupled to a node 134, and an inverting input coupled to the output of the operational amplifier 104 via the node 134.

The first DAC 112 may include an input terminal coupled to the positive voltage supply 120, an output terminal coupled to the inverting input of the sense amplifier 102, and a control input at which first digital control signals are received, where the first digital control signals determine the voltage output by the first DAC 112 relative to the voltage $V_{CC}$ received from the positive voltage supply 120. For example, the voltage output by the first DAC 112 may be between equal to the positive supply voltage $V_{CC}$ minus around 0.2 V and around 1 V (depending on the values of the first digital control signals). Herein, an example amount that is said to be "around" or "approximately" a given value is considered to be within +/−10% of the given value unless otherwise indicated.

The second DAC 114 may include an input terminal coupled to each of the output of the sense amplifier 102 and the gate of the reference transistor 116 via the node 136, an output terminal coupled to a non-inverting input of the operational amplifier 104, and a control input at which second digital control signals are received, where the second digital control signals determine the voltage output by the second DAC 114 relative to the voltage at the node 136 (i.e., the voltage at the output of the sense amplifier 102). For example, given a voltage of around −3 V to around −1.5 V output by the sense amplifier 102, the voltage output by the second DAC 114 may be in a range of around −6.5 V to around −1 V or in a range of around −8 V to around 0 V (depending, at least in part, on the values of the second digital control signals).

The capacitor 110 may be coupled between the node 134 and the negative voltage supply 124. According to various embodiments, the capacitor 110 may have a capacitance in a range of around 1 nF to around 1 μF. For example, the capacitor 110 may improve the transient response at the node 134. The sense resistor 140 may be coupled between the node 138 and the positive voltage supply 120.

The reference transistor 116 may include a drain terminal coupled to the node 138, a source terminal coupled to the reference voltage supply 122, and a gate terminal coupled to the node 136. The amplifier transistor 118 may include a drain terminal coupled to an output 130, a source terminal coupled to the reference voltage supply 122, and a gate terminal coupled to the node 132. The first switch 106 may include an input terminal coupled to the node 134, an output terminal coupled to the node 132, and a control terminal coupled to the first control signal source 126 and configured to receive the variable control signal TX_EN_A. The second switch 108 may include an input terminal coupled to the node 132, an output terminal coupled to the negative voltage supply 124, and a control terminal coupled to the second control signal source 128 and configured to receive the variable control signal TX_EN_B.

A radio frequency (RF) input signal RFIN may be supplied by an RF signal source 142 to the gate of the amplifier transistor 118 via the node 132. The RF input signal RFIN may be amplified by the amplifier transistor 118 to produce an RF output signal RFOUT at the output 130.

The sense amplifier 102 may be configured to compare a first voltage output by the first DAC 112 (e.g., in a range of around 4 V to around 5.2 V) to a second voltage at the node 138 (e.g., in a range of around 8 V to around 10 V), corresponding to the voltage at the drain terminal of the reference transistor 116, then output a third voltage (e.g., in a range of around 2.8 V to around 5 V), based on this comparison, at the node 136. For example, the third voltage output by the sense amplifier 102 may be equal to the difference between the first voltage and the second voltage received by the sense amplifier 102. The second DAC 114 may apply a voltage offset to the third voltage output by the sense amplifier 102 to produce a fourth voltage at its output (e.g., in a range of around −6.5 V to around −1 V or in a range of around −8 V to around 0 V), which the DAC 114 may provide to the non-inverting input of the operational amplifier 104. As indicated above, operational amplifier 104 may be a unity gain amplifier that is configured to output a voltage that is equal to or approximately equal to the voltage received at its non-inverting input. That is, the operational amplifier 104 may receive the fourth voltage at its non-inverting input and may output the fourth voltage (e.g., at the node 134).

The output of the operational amplifier 104 may be selectively coupled to the gate of the amplifier transistor 118 via the first switch 106 and a node 132 disposed between the output of the first switch 106 and the gate of the amplifier transistor 118. The first switch 106 may be selectively opened and closed based on the variable control signal TX_EN_A provided to the control terminal of the first switch 106 by the first control signal source 126. The second switch 108 may be selectively opened and closed based on the variable control signal TX_EN_B provided to the control terminal of the second switch 108 by the second control signal source 128. Herein, a switch or transistor is considered to be "closed", "on", or "activated" when a relatively low impedance path is provided between the input terminal of the switch and the output terminal of the switch, permitting electric current to flow between its input terminal and its output terminal. Herein, a switch or transistor is considered to be "open", "off" or "deactivated" when a relatively high impedance path is provided between its input terminal and its output terminal, such that the flow of current is reduced or blocked therebetween. For example, herein, a bipolar junction transistor (BJT) is considered to be "on", when operating in its saturation region, and is considered to be "off" when operating in its cutoff region.

In one or more embodiments, the first control signal source 126 and the second control signal source 128 may be configured such that the first control signal source 126 only closes the first switch 106 (e.g., by asserting the variable control signal TX_EN_A) after the second control signal source 128 has opened the second switch 108 (e.g., by deasserting the variable control signal TX_EN_B), and such that the second control signal source 128 only closes the second switch 108 (e.g., by asserting the variable control signal TX_EN_B) after the first control signal source 126 has opened the first switch 106 (e.g., by deasserting the variable control signal TX_EN_A). Such configuration of the first control signal source 126 and the second control signal source 128 may prevent the first switch 106 and the second switch 108 from being closed simultaneously and may thereby prevent undesirable shoot-through current through the first switch 106 and the second switch 108. The variable control signals TX_EN_A and TX_EN_B may be at around 1.8 V when asserted and around 0 V when deasserted.

When the first switch 106 is open and the second switch 108 is closed, the gate of the amplifier transistor 118 is coupled to the negative voltage supply 124 and receives the negative voltage $V_{EE}$ (e.g., around −8 V), which causes the amplifier transistor 118 to be open (disabled). When the first switch 106 is closed and the second switch 108 is open, the gate of the amplifier transistor 118 is coupled to the output of the operational amplifier 104 (e.g., configured to provide a voltage in a range of around −6.5 V to around −1 V or in a range of around −8 V to around 0 V), where the voltage output by the operational amplifier 104 provides as a DC bias at the gate of the amplifier transistor 118 sufficient to activate the amplifier transistor 118 (e.g., when RFIN is also sufficiently high).

In one or more embodiments, the reference transistor 116 and the amplifier transistor 118 may each be formed on the same semiconductor die and in close proximity to one another, such that the reference transistor 116 exhibits process and temperature dependencies that are similar to those of the amplifier transistor 118. As a non-limiting example, the reference transistor 116 and the amplifier transistor 118 may each be Gallium Nitride (GaN) field effect transistors (FETs) formed on the same GaN die or GaN-on-SiC die as non-limiting examples. Process and temperature dependencies exhibited by the reference transistor 116 affect the voltage at the node 138, which causes corresponding changes in the voltage output by the sense amplifier 102, observable at the node 136, which causes corresponding changes in the voltage provided at the gate of the amplifier transistor 118 (i.e., the "bias voltage") when the first switch 106 is closed. In this way, process and temperature dependencies of the amplifier transistor 118 may be accounted for by dynamically adjusting the bias voltage supplied to the gate of the amplifier transistor 118 based on the similar process and temperature dependencies of the reference transistor 116.

In one or more embodiments, the non-inverting input of the operational amplifier 104 may receive a voltage in a range of around −6.5 V to around −1 V or in a range of around −8 V to around 0 V from the output of the second DAC 114, while the positive voltage supply terminal of the operational amplifier 104 is configured to receive the positive voltage $V_{CC}$, which may be at or around 5 V, the negative voltage supply terminal of the operational amplifier 104 is configured to receive the negative voltage $V_{EE}$, which may be at or around −8 V, and a reference voltage supply terminal configured to receive a reference voltage $V_{RTGND}$, which may be around 0 V. Thus, the voltage differential between any of the inverting input terminal, non-inverting input terminal or output terminal of the operational amplifier 104 and the voltage supply terminals of the operational amplifier 104, or between the voltage supply terminals themselves, may be as high as 8 V or higher, in accordance with one or more embodiments. Conventional MOS transistor devices typically have gate-source, gate-drain, and drain-source breakdown voltages that are respectively lower than these values (e.g., such breakdown voltages may typically be around 2.5 V). In one or more embodiments, to prevent or mitigate damage to transistor devices of the operational amplifier 104 due to over-voltage, the operational amplifier 104 may include one or more cascode arrangements that are configured to limit the voltage drop across any two terminals of such transistor devices to be below corresponding, predefined breakdown voltage thresholds (sometimes referred to herein as "voltage limits") of those transistor devices, as described below.

Figure 2:
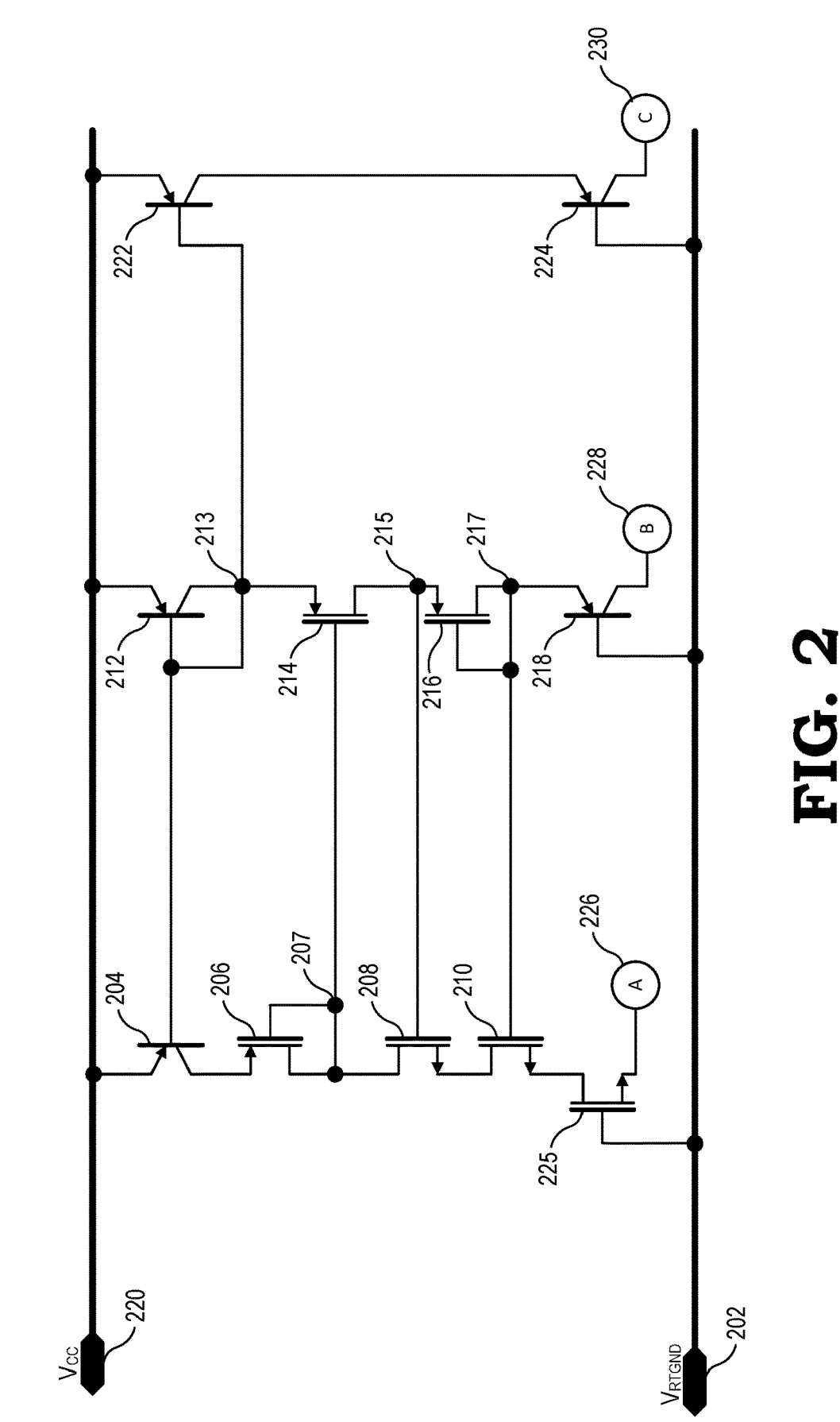
FIGS. 2 and 3 are block diagrams illustrating respective first and second portions of an example amplifier device, which may be included in the transistor gate control circuitry of FIG. 1, in accordance with various embodiments.
Figure 3:
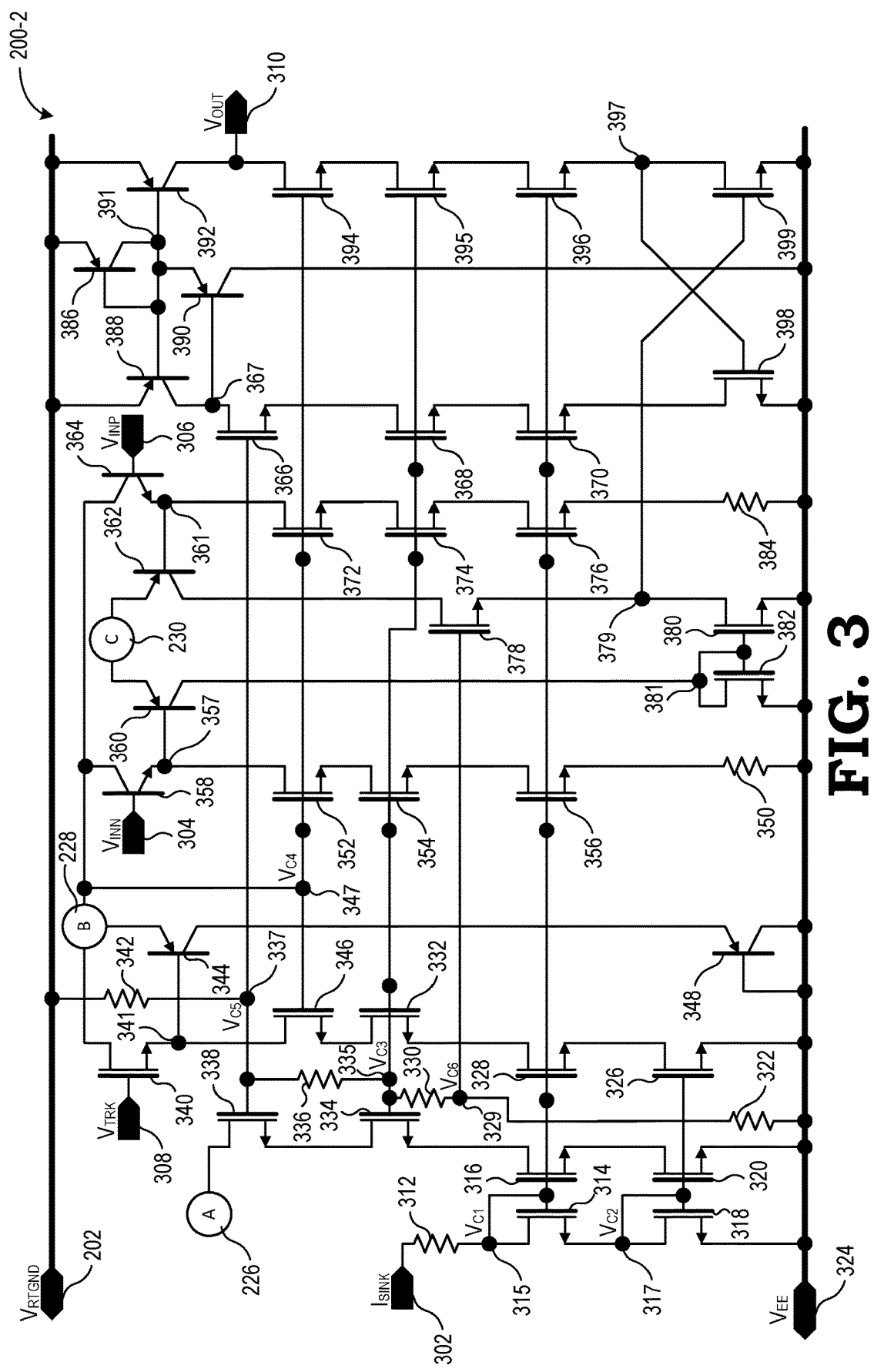

FIGS. 2 and 3 show block diagrams corresponding to respective first and second portions 200-1, 200-2 of an amplifier device 200 (sometimes referred to herein as the "amplifier 200") having an extended voltage range due, at least in part, to one or more cascode arrangements coupled between terminals of the amplifier device 200. In one or more embodiments, the amplifier device 200 may be implemented as the operation amplifier 104 of the control circuitry

100 of FIG. 1. It should be understood that, with reference to arrangements of components of the amplifier device 200, the term "coupled" should be understood to mean at least "electrically coupled" unless otherwise indicated.

Referring simultaneously to FIG. 2 and FIG. 3, the amplifier device 200 may include p-channel MOS (pMOS) transistors 206, 214, 216, n-channel MOS (nMOS) transistors 208, 210, 225, 314, 316, 318, 320, 326, 328, 332, 334, 338, 340, 346, 352, 354, 356, 366, 368, 370, 372, 374, 376, 378, 380, 382, 394, 395, 396, 398, 399, bipolar junction transistors (BJTs) 204, 212, 218, 222, 224, 344, 348, 358, 360, 362, 364, 386, 388, 390, 392, and resistances 312, 322, 330, 336, 342, 350, 384. Any of the resistances 312, 322, 330, 336, 342, 350, 384 may be implemented via a single resistor or other electrically resistive element or multiple resistors or electrically resistive elements in accordance with various embodiments. In one or more embodiments, each of the BJTs 204, 212, 218, 222, 224, 344, 348, 360, 362, 386, 388, 390, 392 may be PNP BJTs. In one or more embodiments, each of the BJTs 358, 364 may be NPN BJTs. In one or more embodiments, the transistors 206, 208, 210, 214, 216, 225, 314, 316, 318, 320, 326, 328, 332, 334, 338, 340, 346, 352, 354, 356, 366, 368, 370, 372, 374, 376, 378, 380, 382, 394, 395, 396, 398, 399 may each have $V_{GS}$, $V_{DS}$, and $V_{GD}$ voltage limits of around 3 V, such that inter-terminal voltages above around 3 V may stress or damage such transistors.

As will be described, the amplifier device 200 may be coupled to a positive voltage supply configured to provide a positive voltage $V_{CC}$ via a positive voltage supply terminal 220, a reference voltage supply configured to provide a reference voltage $V_{RTGND}$ via a reference voltage supply terminal 202, a negative voltage supply configured to supply a negative voltage $V_{EE}$ via the negative voltage supply terminal 324, and a current supply configured to provide a bias reference current $I_{SINK}$ via a terminal 302. In one or more embodiments, the bias reference current $I_{SINK}$ may establish the bias current level for each of the nMOS transistors having gate terminals coupled to the nodes 315, 317 (i.e., the nMOS transistors 314, 316, 318, 320, 326, 328, 356, 376, 370, 396). In one or more embodiments, the negative voltage $V_{EE}$ and the corresponding negative voltage supply may correspond to the negative voltage $V_{EE}$ and the corresponding negative voltage supply 124 of FIG. 1. In one or more embodiments, the positive voltage $V_{CC}$ and the corresponding positive voltage supply may correspond to the positive voltage $V_{CC}$ and the corresponding positive voltage supply 120 of FIG. 1. In one or more embodiments, the reference voltage $V_{RTGND}$ and the corresponding reference voltage supply may correspond to the reference voltage $V_{GND}$ and the corresponding reference voltage supply 122 of FIG. 1. In one or more embodiments, $V_{EE}$ may be at or around –8 V, $V_{CC}$ may be at or around 5 V, $V_{RTGND}$ may be at or around 0 V, and $I_{SINK}$ may be at or around 20 μA.

The amplifier device 200 may include an inverting input terminal 304 configured to receive an inverting input voltage signal $V_{INN}$. The amplifier device may include a non-inverting input terminal 306 configured to receive a non-inverting input voltage signal $V_{INP}$. The amplifier device 200 may include an output configured to provide an output voltage signal $V_{OUT}$. In one or more embodiments, the amplifier device 200 may be an operational amplifier. In one or more embodiments, the amplifier device 200 may be configured as a unity gain buffer, such that $V_{OUT}$ is equal to or approximately equal to $V_{INP}$. In one or more embodiments in which the amplifier device 200 is configured as a unity gain buffer, the inverting input terminal 304 may be coupled directly to the output terminal 310, such that $V_{INN}$ is equal to or approximately equal to $V_{OUT}$.

The amplifier device 200 may include a tracking voltage input terminal 308 configured to receive a tracking voltage $V_{TRK}$. In one or more embodiments, the tracking voltage $V_{TRK}$ may track the non-inverting input voltage $V_{INP}$, such that $V_{TRK}$ is maintained at a fixed or approximately fixed voltage level of between around 0 V to around 2 V offset from (e.g., above) $V_{INP}$. For example, the tracking voltage input terminal 308 may be coupled to the non-inverting input terminal 306 in one or more such embodiments. In one or more other embodiments, the tracking voltage $V_{TRK}$ may track the non-inverting output voltage $V_{OUT}$, such that $V_{TRK}$ is maintained at a fixed or approximately fixed voltage level of between around 0 V to around 2 V offset from (e.g., above) $V_{OUT}$. For example, the tracking input voltage terminal 308 may be coupled to the output terminal 310 in one or more such embodiments. Herein, a voltage or other value is considered to be "fixed" when that voltage or value has little (e.g., less than 10%) or no variation (e.g., during normal operation of a corresponding circuit or device).

As shown in FIG. 2, the BJT 204 may include an emitter terminal coupled to the positive voltage supply terminal 220, a base terminal coupled to the base terminal of the BJT 212 and to a node 213, and a collector terminal coupled to the source terminal of the pMOS transistor 206. The BJT 212 may include an emitter terminal coupled to the positive voltage supply terminal 220, a base terminal coupled to the base terminal of the BJT 204 and to the node 213, and a collector terminal coupled to the node 213. The BJT 218 may include an emitter terminal coupled to a node 217, a base terminal coupled to the reference voltage supply terminal 202, and a collector terminal coupled to a node 228 (i.e., coupled to the second portion 200-2 of the amplifier device 200, shown in FIG. 3, via the node 228), denoted here as "B". The BJT 222 may include an emitter terminal coupled to the positive voltage supply terminal 220, a base terminal coupled to the node 213, and a collector terminal coupled to the node 213. That is, the base terminal of the BJT 222 is connected to the collector terminal of the BJT 222. The BJT 224 may include an emitter terminal coupled to the node 213, a base terminal coupled to the reference voltage supply terminal 202, and a collector terminal coupled to a node 230 (i.e., coupled to the second portion 200-2 of the amplifier device 200, shown in FIG. 3, via the node 230), denoted here as "C". The BJTs 218, 224 may be arranged in respective common base configurations. The BJTs 204, 222 may be arranged in respective common emitter configurations. The BJT 212 may be arranged in a diode-connected configuration (e.g., the base terminal of the BJT 212 is connected to its collector terminal). The BJTs 204 and 222 may each operate as respective current sources that supply currents at their respective collector terminals. For example, the respective magnitudes of these currents are scaled based on the current magnitude through the diode-connected BJT 212 and respective ratios of relative transistor areas, where such ratios may be respectively defined as the area of the BJT 204 divided by the area of the BJT 212 and the area of the BJT 222 divided by the area of the BJT 212.

The pMOS transistor 206 may include a source terminal coupled to the collector terminal of the BJT 204, a gate terminal coupled to a node 207, and a drain terminal coupled to the node 207. That is, the gate terminal of the pMOS transistor 206 may be coupled to the drain terminal of the pMOS transistor 206, such that the pMOS transistor 206 is configured as a diode-connected transistor. Current flow between the source and drain terminals of the pMOS transistor 206 may be controlled by the voltage at the node 207.

The pMOS transistor 214 may include a source terminal coupled to the node 213, a gate terminal coupled to a node 207, and a drain terminal coupled to the node 215. Current flow between the source and drain terminals of the pMOS transistor 214 may be controlled by the voltage at the node 207.

The pMOS transistor 216 may include a source terminal coupled to the node 215, a gate terminal coupled to a node 217, and a drain terminal coupled to the node 217. That is, the gate terminal of the pMOS transistor 216 may be coupled to the drain terminal of the pMOS transistor 216, such that the pMOS transistor 216 is configured as a diode-connected transistor. Current flow between the source and drain terminals of the pMOS transistor 216 may be controlled by the voltage at the node 217.

The nMOS transistor 208 may include a drain terminal coupled to the node 207, a gate terminal coupled to the node 215, and a source terminal coupled to the drain terminal of the nMOS transistor 210. Current flow between the source and drain terminals of the nMOS transistor 208 may be controlled by the voltage at the node 215.

The nMOS transistor 210 may include a drain terminal coupled to the source terminal of the nMOS transistor 208, a gate terminal coupled to the node 217, and a source terminal coupled to the drain terminal of the nMOS transistor 225. Current flow between the source and drain terminals of the nMOS transistor 210 may be controlled by the voltage at the node 217.

The nMOS transistor 225 may include a drain terminal coupled to the source terminal of the nMOS transistor 210, a gate terminal coupled to the reference voltage supply terminal 202, and a source terminal coupled to the node 226 (i.e., coupled to the second portion 200-2 of the amplifier device 200, shown in FIG. 3, via the node 226), denoted here as "A". Current flow between the source and drain terminals of the nMOS transistor 225 may be controlled by the voltage at the reference voltage supply terminal 202 (i.e., by $V_{RTGND}$) and may be at least partly dependent on the reference current $I_{SINK}$. For example, the nMOS transistors 314, 316, 318, 328 are arranged as a cascode current mirror, such that the reference current $I_{SINK}$ supplied via the terminal 302 causes a corresponding current (equal to or approximately equal to the reference current $I_{SINK}$) to flow from the terminal 226 to the terminal 324 via at least the transistors 204, 206, 208, 210, 225, 316, 320, 334, 338.

As shown in FIG. 3, the BJT 344 may include an emitter terminal coupled to the node 228, a base terminal coupled to the node 341, and a collector terminal coupled to the emitter terminal of the BJT 348. The BJT 348 may include an emitter terminal coupled to the collector terminal of the BJT 344, a base terminal coupled to the negative voltage supply terminal 324, and a collector terminal coupled to the negative voltage supply terminal 324. The BJT 358 may include an emitter terminal coupled to the node 357, a base terminal coupled to the inverting input terminal 304, and a collector terminal coupled to the node 228. The BJT 360 may include an emitter terminal coupled to the node 230, a base terminal coupled to the node 357, and a collector terminal coupled to the node 381. The BJT 362 may include an emitter terminal coupled to the node 230, a base terminal coupled to the node 361, and a collector terminal coupled to the drain terminal of the nMOS transistor 378. The BJT 364 may include an emitter terminal coupled to the node 361, a base terminal coupled to the non-inverting input terminal 306, and a collector terminal coupled to the node 228. The BJT 386 may include an emitter terminal coupled to the reference voltage supply terminal 202, a base terminal coupled to the node 391, and a collector terminal coupled to the node 391. That is, the base terminal of the BJT 386 may be coupled to the collector terminal of the BJT 386, such that the BJT 386 is configured as a diode-connected transistor. The BJT 388 may include an emitter terminal coupled to the reference voltage supply terminal 202, a base terminal coupled to the node 391, and a collector terminal coupled to the node 367. The BJT 390 may include an emitter terminal coupled to the reference voltage supply terminal 202, a base terminal coupled to the node 391, and a collector terminal coupled to the output terminal 310. The BJT 392 may include an emitter terminal coupled to the node 391, a base terminal coupled to the node 367, and a collector terminal coupled to the negative voltage supply terminal 324.

The nMOS transistor 314 may include a drain terminal coupled to the node 315, a gate terminal coupled to the node 315, and a source terminal coupled to the node 317. That is, the gate terminal of the nMOS transistor 314 may be coupled to the drain terminal of the nMOS transistor 314, such that the nMOS transistor 314 is configured as a diode-connected transistor. Current flow between the source and drain terminals of the nMOS transistor 314 may be controlled by the voltage at the node 315 (e.g., which is dependent on the current $I_{SINK}$). For example, the nMOS transistor 314 may have a $V_{GS}$ that supports a drain-to-source current ($I_{DS}$) that is equal to or approximately equal to the current $I_{SINK}$ (e.g., 20 μA).

The nMOS transistor 316 may include a drain terminal coupled to the source terminal of the nMOS transistor 334, a gate terminal coupled to the node 315, and a source terminal coupled to drain terminal of the nMOS transistor 320. Current flow between the source and drain terminals of the nMOS transistor 316 may be controlled by the voltage at the node 315 (e.g., which is dependent on the current $I_{SINK}$).

The nMOS transistor 318 may include a drain terminal coupled to the node 317, a gate terminal coupled to the node 317, and a source terminal coupled to negative voltage supply terminal 324. That is, the gate terminal of the nMOS transistor 318 may be coupled to the drain terminal of the nMOS transistor 318, such that the nMOS transistor 318 is configured as a diode-connected transistor. Current flow between the source and drain terminals of the nMOS transistor 318 may be controlled by the voltage at the node 317. For example, the nMOS transistor 318 may have a $V_{GS}$ that supports an $I_{DS}$ that is equal to or approximately equal to the current $I_{SINK}$ (e.g., 20 μA).

The nMOS transistor 320 may include a drain terminal coupled to the source terminal of the nMOS transistor 316, a gate terminal coupled to the node 317, and a source terminal coupled to negative voltage supply terminal 324. Current flow between the source and drain terminals of the nMOS transistor 320 may be controlled by the voltage at the node 317.

The nMOS transistor 326 may include a drain terminal coupled to the source terminal of the nMOS transistor 328, a gate terminal coupled to the node 317, and a source terminal coupled to negative voltage supply terminal 324. Current flow between the source and drain terminals of the nMOS transistor 326 may be controlled by the voltage at the node 317.

The nMOS transistor 328 may include a drain terminal coupled to the source terminal of the nMOS transistor 332, a gate terminal coupled to the node 315, and a source terminal coupled to drain terminal of the nMOS transistor 326. Current flow between the source and drain terminals of the nMOS transistor 328 may be controlled by the voltage at the node 315.

The nMOS transistor 332 may include a drain terminal coupled to the source terminal of the nMOS transistor 346, a gate terminal coupled to the node 335, and a source terminal coupled to drain terminal of the nMOS transistor 328. Current flow between the source and drain terminals of the nMOS transistor 332 may be controlled by the voltage at the node 335.

The nMOS transistor 334 may include a drain terminal coupled to the source terminal of the nMOS transistor 338, a gate terminal coupled to the node 335, and a source terminal coupled to drain terminal of the nMOS transistor 316. Current flow between the source and drain terminals of the nMOS transistor 334 may be controlled by the voltage at the node 335.

The nMOS transistor 338 may include a drain terminal coupled to the node 226, a gate terminal coupled to the node 337, and a source terminal coupled to drain terminal of the nMOS transistor 334. Current flow between the source and drain terminals of the nMOS transistor 338 may be controlled by the voltage at the node 337.

The nMOS transistor 340 may include a drain terminal coupled to the node 228, a gate terminal coupled to the tracking voltage input terminal 308, and a source terminal coupled to the node 341. Current flow between the source and drain terminals of the nMOS transistor 340 may be controlled by the voltage at the tracking voltage input terminal 308 (i.e., by $V_{TRK}$).

The nMOS transistor 346 may include a drain terminal coupled to the node 341, a gate terminal coupled to the node 347, and a source terminal coupled to the drain terminal of the nMOS transistor 332. The node 347 may be coupled to the node 228. Current flow between the source and drain terminals of the nMOS transistor 346 may be controlled by the voltage at the node 347.

The nMOS transistor 352 may include a drain terminal coupled to the node 357, a gate terminal coupled to the node 347, and a source terminal coupled to the drain terminal of the nMOS transistor 354. Current flow between the source and drain terminals of the nMOS transistor 352 may be controlled by the voltage at the node 347.

The nMOS transistor 354 may include a drain terminal coupled to the source terminal of the nMOS transistor 352, a gate terminal coupled to the node 335, and a source terminal coupled to drain terminal of the nMOS transistor 356. Current flow between the source and drain terminals of the nMOS transistor 354 may be controlled by the voltage at the node 335.

The nMOS transistor 356 may include a drain terminal coupled to the source terminal of the nMOS transistor 354, a gate terminal coupled to the node 315, and a source terminal coupled to the first terminal of the resistance 350. Current flow between the source and drain terminals of the nMOS transistor 356 may be controlled by the voltage at the node 315.

The nMOS transistor 366 may include a drain terminal coupled to the node 367, a gate terminal coupled to the node 337, and a source terminal coupled to the drain terminal of the nMOS transistor 368. Current flow between the source and drain terminals of the nMOS transistor 366 may be controlled by the voltage at the node 337.

The nMOS transistor 368 may include a drain terminal coupled to the source terminal of the nMOS transistor 366, a gate terminal coupled to the node 335, and a source terminal coupled to drain terminal of the nMOS transistor 370. Current flow between the source and drain terminals of the nMOS transistor 368 may be controlled by the voltage at the node 335.

The nMOS transistor 370 may include a drain terminal coupled to the source terminal of the nMOS transistor 368, a gate terminal coupled to the node 315, and a source terminal coupled to drain terminal of the nMOS transistor 398. Current flow between the source and drain terminals of the nMOS transistor 370 may be controlled by the voltage at the node 315.

The nMOS transistor 372 may include a drain terminal coupled to the node 361, a gate terminal coupled to the node 347, and a source terminal coupled to drain terminal of the nMOS transistor 374. Current flow between the source and drain terminals of the nMOS transistor 372 may be controlled by the voltage at the node 347.

The nMOS transistor 374 may include a drain terminal coupled to the source terminal of the nMOS transistor 372, a gate terminal coupled to the node 335, and a source terminal coupled to drain terminal of the nMOS transistor 376. Current flow between the source and drain terminals of the nMOS transistor 374 may be controlled by the voltage at the node 335.

The nMOS transistor 376 may include a drain terminal coupled to the source terminal of the nMOS transistor 374, a gate terminal coupled to the node 315, and a source terminal coupled to first terminal of the resistance 384. Current flow between the source and drain terminals of the nMOS transistor 376 may be controlled by the voltage at the node 315.

The nMOS transistor 378 may include a drain terminal coupled to the collector terminal of the BJT 362, a gate terminal coupled to the node 329, and a source terminal coupled to node 379. Current flow between the source and drain terminals of the nMOS transistor 378 may be controlled by the voltage at the node 329.

The nMOS transistor 380 may include a drain terminal coupled to the node 379, a gate terminal coupled to the node 381, and a source terminal coupled to negative voltage supply terminal 324. Current flow between the source and drain terminals of the nMOS transistor 380 may be controlled by the voltage at the node 381.

The nMOS transistor 382 may include a drain terminal coupled to the node 381, a gate terminal coupled to the node 381, and a source terminal coupled to the negative voltage supply terminal 324. That is, the gate terminal of the nMOS transistor 382 may be coupled to the drain terminal of the nMOS transistor 382, such that the nMOS transistor 382 is configured as a diode-connected transistor. Current flow between the source and drain terminals of the nMOS transistor 382 may be controlled by the voltage at the node 381.

The nMOS transistor 394 may include a drain terminal coupled to the output terminal 310, a gate terminal coupled to the node 347, and a source terminal coupled to drain terminal of the nMOS transistor 395. Current flow between the source and drain terminals of the nMOS transistor 394 may be controlled by the voltage at the node 347.

The nMOS transistor 395 may include a drain terminal coupled to the source terminal of the nMOS transistor 394, a gate terminal coupled to the 335, and a source terminal coupled to the drain terminal of the nMOS transistor 396. Current flow between the source and drain terminals of the nMOS transistor 395 may be controlled by the voltage at the node 335.

The nMOS transistor 396 may include a drain terminal coupled to the source terminal of the nMOS transistor 395, a gate terminal coupled to the node 315, and a source terminal coupled to the node 397. Current flow between the source and drain terminals of the nMOS transistor 396 may be controlled by the voltage at the node 315.

The nMOS transistor 398 may include a drain terminal coupled to the source terminal of the nMOS transistor 370, a gate terminal coupled to the node 397, and a source terminal coupled to the negative voltage supply terminal 324. Current flow between the source and drain terminals of the nMOS transistor 398 may be controlled by the voltage at the node 397.

The nMOS transistor 399 may include a drain terminal coupled to the source terminal of the nMOS transistor 396, a gate terminal coupled to the node 379, and a source terminal coupled to negative voltage supply terminal 324. Current flow between the source and drain terminals of the nMOS transistor 399 may be controlled by the voltage at the node 379.

The resistance 312 may include a first terminal coupled to the current supply terminal 302 and a second terminal coupled to the node 315. The resistance 322 may include a first terminal coupled to the node 329 and a second terminal coupled to the negative voltage supply terminal 324. The resistance 330 may include a first terminal coupled to the node 335 and a second terminal coupled to the node 329. The resistance 336 may include a first terminal coupled to the node 337 and a second terminal coupled to the node 335. The resistance 342 may include a first terminal coupled to the reference voltage supply terminal 202 and a second terminal coupled to the node 337. The resistance 350 may include a first terminal coupled to the source of the nMOS transistor 356 and a second terminal coupled to the negative voltage supply terminal 324. The resistance 384 may include a first terminal coupled to the source of the nMOS transistor 376 and a second terminal coupled to the negative voltage supply terminal 324. The resistances 322, 330, 336, 342 may be arranged as a voltage divider that is coupled between reference voltage supply terminal 202 and the negative voltage supply terminal 324. In one or more embodiments, the resistances 312, 322, 330, 336, 342, 350, 384 may have respective resistance values in a range of around 10 k$\Omega$ to around 100 k$\Omega$.

The amplifier device 200 may include multiple cascode arrangements, which may increase the operational voltage range of the amplifier device 200. For example, each cascode arrangement may mitigate or prevent overvoltage conditions that might otherwise occur across transistors of the amplifier device 200 by distributing the voltage drop between two corresponding terminals or nodes of the amplifier device 200 across multiple series-connected transistors of that cascode arrangement. In one or more embodiments, the amplifier device 200 may include first, second, third, fourth, fifth, sixth, and seventh cascode arrangements. For example, the first cascode arrangement of the amplifier device 200 may include a first set of series-connected transistors (i.e., transistors connected in series, source-to-drain) coupled between the negative voltage supply terminal 324 and the output terminal 310. The first set of series-connected transistors may include at least the nMOS transistors 394, 395, 396, each corresponding to a respective cascode stage of the first cascode arrangement. The nMOS transistors 395, 396 of the first cascode arrangement may be configured to receive respective fixed bias voltages (e.g., $V_{C1}$, $V_{C3}$) at their respective gate terminals, while the nMOS transistor 394 of the first cascode arrangement may be configured to receive a variable bias voltage (e.g., $V_{C4}$) at its gate terminal to accommodate changes in $V_{OUT}$.

For example, the second cascode arrangement of the amplifier device 200 may include a second set of series-connected transistors coupled between the node 367 (which is coupled to the reference voltage supply terminal 202 via the BJT 388) and the negative voltage supply terminal 324. The second set of series-connected transistors may include the nMOS transistors 366, 368, 370, each corresponding to a respective cascode stage of the second cascode arrangement. Each transistor of the second cascode arrangement may be configured to receive a respective fixed bias voltage (e.g., $V_{C1}$, $V_{C3}$, $V_{C5}$) at its gate terminal, at least because the voltage difference between the negative voltage supply terminal 324 and the reference voltage supply terminal 202 is fixed or substantially fixed.

For example, the third cascode arrangement of the amplifier device 200 may include a third set of series-connected transistors coupled between the node 361 and the negative voltage supply terminal 324 (e.g., via the resistance 384). The third set of series-connected transistors may include the nMOS transistors 372, 374, 376, each corresponding to a respective cascode stage of the third cascode arrangement. The node 361 may be coupled to the node 228 via the BJT 364, which is controlled by the non-inverting input voltage $V_{INP}$ provided at the non-inverting input terminal 306. The voltage at the node 228 may be set, primarily, based on the voltage $V_{TRK}$ at the node 308 shifted down by the $V_{GS}$ of the nMOS transistor 340, and based on the voltage at the node 341 shifted up by the base-emitter voltage ($V_{BE}$) of the BJT 344. In one or more embodiments, the $V_{GS}$ of the nMOS transistor 340 is equal to or approximately equal to the $V_{BE}$ of the BJT 344, such that the shifts across the nMOS transistor 340 and the BJT 344 substantially cancel one another out, resulting in a voltage at the node 228 is equal to or approximately equal to $V_{TR}$K. In one or more such embodiments, the current sourced by the collector terminal of the BJT 218 of FIG. 2 at the node 228 is greater than the combined currents flowing into the collectors of the BJTs 358, 364 (e.g., such that the remaining current flows into the emitter of the BJT 334 and biases the BJT 344 to operate in an emitter follower configuration).

The nMOS transistors 374, 376 of the third cascode arrangement may be configured to receive respective fixed bias voltages (e.g., $V_{C1}$, $V_{C3}$) at their respective gate terminals, while the nMOS transistor 372 of the third cascode arrangement may be configured to receive a variable bias voltage (e.g., $V_{C4}$) at its gate terminal to accommodate changes in the voltage at the node 361 caused by changes to the voltages $V_{TRK}$ and $V_{INP}$. The third cascode arrangement, in combination with the resistance 384, may act as a current source that provides bias current to the BJT 364.

For example, the fourth cascode arrangement of the amplifier device 200 may include a fourth set of series-connected transistors coupled between the node 357 and the negative voltage supply terminal 324 (e.g., via the resistance 350). The fourth set of series-connected transistors may include the nMOS transistors 352, 354, 356, each corresponding to a respective cascode stage of the fourth cascode arrangement. The node 357 may be coupled to the node 228 via the BJT 358, which is controlled by the inverting input voltage $V_{INN}$ provided at the inverting input terminal 304. The BJTs 358, 360 may be in an up-down emitter follower arrangement and the BJTs 362, 364 may be in an up-down emitter follower arrangement, such that the voltage at the node 230 is equal to or approximately equal to $V_{INN}$ and $V_{INP}$. This means that the collector-base voltage ($V_{CB}$) of each of the BJTs 358, 364 is at or around 0 V. The nMOS transistors 354, 356 of the fourth cascode arrangement may be configured to receive respective fixed bias voltages (e.g., $V_{C1}, V_{C3}$) at their respective gate terminals, while the nMOS transistor 352 of the fourth cascode arrangement may be configured to receive a variable bias voltage (e.g., $V_{C4}$) at its gate terminal to accommodate changes in the voltage at the node 361 caused by changes to the voltages $V_{TRK}$ and $V_{INP}$. The fourth cascode arrangement may act as a current source that provides bias current to the BJT 358.

For example, the fifth cascode arrangement of the amplifier device 200 may include a fifth set of series-connected transistors coupled between the node 341 and the negative voltage supply terminal 324. The fifth set of series-connected transistors may include the nMOS transistors 326, 328, 332, 346, each corresponding to a respective cascode stage of the fifth cascode arrangement. The node 341 may be coupled to the node via the nMOS transistor 340, which is controlled by the tracking voltage $V_{TRK}$ provided at the tracking voltage input terminal. The nMOS transistors 326, 328, 332 of the fifth cascode arrangement may be configured to receive respective fixed bias voltages (e.g., $V_{C1}$, $V_{C2}$, $V_{C3}$) at their respective gate terminals, while the nMOS transistor 346 of the fifth cascode arrangement may be configured to receive a variable bias voltage (e.g., $V_{C4}$) at its gate terminal to accommodate changes in the voltage at the node 341 caused by changes to the tracking voltage $V_{TRK}$.

For example, the sixth cascode arrangement of the amplifier device 200 may include a sixth set of series-connected transistors coupled between the node 226 and the negative voltage supply terminal 324. The sixth set of series-connected transistors may include the nMOS transistors 316, 320, 334, 338, each corresponding to a respective cascode stage of the sixth cascode arrangement. The node 226 may be biased to at or around $V_{RTGND}$ minus the $V_{GS}$ of the nMOS transistor 225. Each transistor of the sixth cascode arrangement may be configured to receive a respective fixed (or substantially fixed) bias voltage (e.g., $V_{C1}$, $V_{C2}$, $V_{C3}$, $V_{C5}$) at its gate terminal.

For example, the seventh cascode arrangement of the amplifier device 200 may include at least one transistor coupled between the collector of the BJT 362 and the node 379. The at least one transistor of the seventh cascode arrangement may include the nMOS transistor 378. The nMOS transistor 378 of the seventh cascode arrangement may be configured to receive a fixed bias voltage (e.g., $V_{C6}$) at its gate terminal. The nMOS transistor 378 may be configured to prevent the voltage at the node 379 from exceeding the voltage at the node 329 (i.e., $V_{C6}$).

Fixed or variable bias voltages may be provided to each cascode stage of the cascode arrangements via the nodes 315, 317, 329, 335, 337, 347 (sometimes referred to herein as "cascode bias control nodes" or "bias nodes"). For example, a first cascode bias voltage $V_{C1}$ may be provided to gate terminals of the nMOS transistors 316, 328, 356, 376, 370, 396 via the cascode bias control node 315. A second cascode bias voltage $V_{C2}$ may be provided to gate terminals of the nMOS transistors 320, 326 via the cascode bias control node 317. In one or more embodiments, the first cascode bias voltage $V_{C1}$ may be around 0.7 V higher than the second cascode bias voltage $V_{C2}$ due to the voltage drop across the diode-connected nMOS transistor 314. The cascode bias voltages $V_{C1}$ and $V_{C2}$ may be considered fixed at least because they depend on the current supplied via the terminal 302, which is constant or substantially constant. A third cascode bias voltage $V_{C3}$ may be provided to the gate terminals of the nMOS transistors 332, 334, 354, 374, 368, 395 via the cascode bias control node 335. A fourth cascode bias voltage $V_{C4}$ may be provided to the gate terminals of the nMOS transistors 346, 352, 372, 394. In one or more embodiments, the fourth cascode bias voltage $V_{C4}$ may be equal to $V_{TRK}$ minus the $V_{GS}$ of the nMOS transistor 340 plus the $V_{BE}$ of the BJT 344. Assuming the $V_{GS}$ of the nMOS transistor 340 is similar to the $V_{BE}$ of the BJT 344 (e.g., around 0.7 V to around 1 V), the value of the voltage $V_{C4}$ may be equal to or approximately equal to the tracking voltage $V_{TRK}$ (which, in turn, is equal to or approximately equal to the voltages $V_{INP}$, $V_{OUT}$). A fifth cascode bias voltage $V_{C5}$ may be provided to the gate terminals of the nMOS transistors 338, 366 via the cascode bias control node 337. A sixth cascode bias voltage $V_{C6}$ may be provided to the gate terminal of the nMOS transistor 378 via the cascode bias control node 329.

In one or more embodiments, the cascode bias voltages $V_{C1}$, $V_{C2}$, $V_{C3}$, $V_{C5}$, and $V_{C6}$ may be a fixed voltages that are independent from the voltages $V_{INN}$, $V_{INP}$. In one or more embodiments, the cascode bias voltage $V_{C4}$ may be a variable voltage that is equal to or approximately equal to $V_{TR}K$, $V_{INP}$, and $V_{OUT}$, such that the value of $V_{C4}$ changes as $V_{TRK}$, $V_{INP}$, and $V_{OUT}$ change, as explained above. The cascode bias control nodes 329, 335, 337 may be nodes of a voltage divider that includes the resistances 322, 330, 336, 342 coupled in series between the reference voltage supply terminal 202 and the negative voltage supply terminal 324.

It should be understood that, in one or more other embodiments, more or fewer cascode stages than those shown in the present example may be included in the cascode arrangement (e.g., to accommodate higher or lower operating voltage ranges of the amplifier device 200).

During operation of the amplifier device 200, the BJTs 360, 362 may form a differential input pair configure to receive the inverting input voltage $V_{INN}$ and the non-inverting input voltage $V_{INP}$, respectively. The BJTs 358, 364 may be arranged in respective emitter-follower configurations and may reduce bias currents at the inverting input terminal 304 and the non-inverting input terminal 306, respectively. The nMOS transistors 380, 382 may form an active load for the differential input pair and may provide the drive signal for the output stage (e.g., the nMOS transistors 396, 395, 394) via the node 379.

The amplifier device 200 may have an output voltage range of between around −8 V and around 0 V, as a non-limiting example, and the voltage $V_{INN}$, $V_{INP}$, and $V_{OUT}$ may each be at or around the same value within the output voltage range during normal operation of the amplifier device 200. For example, $V_{OUT}$ and $V_{INN}$ (and, in one or more embodiments, $V_{TRK}$) may each be within 10% of the value of $V_{INP}$ during normal operation of the amplifier device 200. The BJT 392 may be configured to source current to the output terminal 310 and may have a sufficiently high collector-emitter voltage ($V_{C}E$) limit, such that it can operate safely over the required output voltage range of the amplifier device 200 (e.g., having a $V_{CE}$ limit of around or above 8 V). The nMOS transistor 399 may be configured to sink current from the output terminal 310. The nMOS transistor 399 may be limited to a maximum $V_{DS}$ of around 3 V or around 2.5 V according to various embodiments. Given such a $V_{DS}$ limit, the output voltage range of the amplifier device 200 (e.g., up to an 8 V differential between $V_{EE}$ and $V_{OUT}$) would exceed the maximum $V_{DS}$ limit of the nMOS transistor 399 if the drain of the nMOS transistor 399 were connected directly to the output terminal 310.

In a given cascode arrangement, each cascode stage protects either the transistor of an adjacent cascode stage or one or more devices to which that cascode stage is coupled by limiting the voltage provided to such transistors or devices. For example, considering the first cascode arrangement of the amplifier device 200, the nMOS transistor 396 prevents the $V_{DS}$ limit of the nMOS transistor 399 from being exceeded by limiting the voltage at the drain terminal of the nMOS transistor 399. The nMOS transistor 395 prevents the $V_{DS}$ limit of the nMOS transistor 396 from being exceeded by limiting the voltage at the drain terminal of the nMOS transistor 396. The nMOS transistor 394 prevents the $V_{DS}$ limit of the nMOS transistor 395 from being exceeded by limiting the voltage at the drain terminal of the nMOS transistor 395. The values of the cascode bias voltages $V_{C1}$, $V_{C2}$, $V_{C3}$, $V_{C4}$, $V_{C5}$, and $V_{C6}$ may be set such that the $V_{GS}$ and $V_{GD}$ limits (e.g., each around 2.5 V to around 3 V) of the transistors of the cascode arrangements of the amplifier device 200 are not exceeded.

The values of the voltages $V_{INN}$, $V_{INP}$, $V_{OUT}$, and $V_{TRK}$ may vary within the output voltage range (e.g., a range of around –8 V to around 0 V) of the amplifier device 200 during its operation. To account for such variation in these voltages, at least one of the cascode bias voltages provide to one or more of the cascode arrangements of the amplifier device 200 may be a variable voltage, rather than a fixed voltage. For example, the fifth cascode bias voltage $V_{C5}$ at the fifth cascode bias control node 347 may vary depending on the value of $V_{TRK}$ (which, as noted above, tracks the voltage of $V_{INP}$ or $V_{OUT}$, according to various embodiments). In this way, the voltage used to bias the nMOS transistors 346, 352, 372, 394 may be dependent on the value of $V_{TR}$K, which may accommodate changes in the drain terminal voltages of these transistors (which are, in turn, respectively equal to or dependent on $V_{TRK}$, $V_{INN}$, $V_{INP}$, or $V_{OUT}$).

As a non-limiting example, given $V_{INP}$, $V_{INN}$, $V_{TR}$K, and $V_{OUT}$ values of around –1 V, a negative voltage $V_{EE}$ of –8 V, and a reference voltage $V_{RTGND}$ of 0V, the first cascode bias voltage $V_{C1}$ is around –6.60 V, the second cascode bias voltage $V_{C2}$ is around –7.30 V, the third cascode bias voltage $V_{C3}$ is around –4.37 V, the fourth cascode bias voltage $V_{C4}$ is around –1.00 V (i.e., equal to or approximately equal to $V_{TRK}$ and $V_{OUT}$), the fifth cascode bias voltage $V_{C5}$ is around –2.12 V, and the sixth cascode bias voltage $V_{C6}$ is at or around –4.86 V. Continuing the example, the drain voltage of the nMOS transistor 395 is around –1.70 V, the drain voltage of the nMOS transistor 396 is around –5.07 V, and the drain voltage of the nMOS transistor 399 is around –7.30 V. As illustrated this example, the inter-terminal voltage limits of the nMOS transistors 394, 395, 396, and 399 are not exceeded given the condition in which $V_{OUT}$, $V_{INN}$, $V_{INP}$, $V_{TRK}$ are each equal to or approximately equal to –1 V. It should be understood that the transistors included in or coupled to the other cascode arrangements of the amplifier device 200 are similarly protected against inter-terminal over-voltage conditions in this example.

As another non-limiting example, given $V_{INP}$, $V_{INN}$, $V_{TR}$K, and $V_{OUT}$ values of around –4 V, a negative voltage $V_{EE}$ of –8 V, and a reference voltage $V_{RTGND}$ of 0V, the first cascode bias voltage $V_{C1}$ is around –6.60 V, the second cascode bias voltage $V_{C2}$ is around –7.30 V, the third cascode bias voltage $V_{C3}$ is around –4.37 V, the fourth cascode bias voltage $V_{C4}$ is around –4.00 V (i.e., equal to or approximately equal to $V_{TRK}$ and $V_{OUT}$), the fifth cascode bias voltage $V_{C5}$ is around –2.12 V, and the sixth cascode bias voltage $V_{C6}$ is at or around –4.86 V. Continuing the example, the drain voltage of the nMOS transistor 395 is around –4.70 V, the drain voltage of the nMOS transistor 396 is around –5.07 V, and the drain voltage of the nMOS transistor 399 is around –7.30 V. As illustrated this example, the inter-terminal voltage limits of the nMOS transistors 394, 395, 396, and 399 are not exceeded given the condition in which $V_{OUT}$, $V_{INN}$, $V_{INP}$, $V_{TRK}$ are each equal to or approximately equal to –4 V. It should be understood that the transistors included in or coupled to the other cascode arrangements of the amplifier device 200 are similarly protected against inter-terminal over-voltage conditions in this example.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in one or more embodiments of the depicted subject matter. Furthermore, the term "amplifier" used herein should be understood to refer to a "power amplifier" unless noted otherwise.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier device comprising:
a first input terminal configured to receive a first input voltage;
a first voltage supply terminal;
an output terminal configured to provide an output voltage; and
a first cascode arrangement electrically coupled between the first voltage supply terminal and the output terminal, the first cascode arrangement comprising:
a first transistor having a first drain terminal electrically coupled to the output terminal, a first source terminal electrically coupled to the first drain terminal, and a first gate terminal that is configured to receive a variable bias voltage and to control the flow of current from the first drain terminal to the first source terminal, wherein the variable bias voltage corresponds to the first input voltage; and
a second transistor having a second drain terminal electrically coupled to the first source terminal of the first transistor, a second source terminal electrically coupled to the first voltage supply terminal and to the second drain terminal, and a second gate terminal that is configured to receive a fixed bias voltage and to control the flow of current from the second drain terminal to the second source terminal;

a second voltage supply terminal; and a voltage divider coupled between the first voltage supply terminal and the second voltage supply terminal, wherein the second gate terminal of the second transistor is configured to receive the fixed bias voltage via a node of the voltage divider.

2. The amplifier device of claim 1, further comprising:

a first bipolar junction transistor (BJT) having a first emitter terminal coupled to the second voltage supply terminal, a first collector terminal coupled to the output terminal, and a first base terminal;

a second BJT having a second emitter terminal coupled to the second voltage supply terminal, a second collector terminal, and a second base terminal coupled to the first base terminal of the first BJT; and a second cascode arrangement coupled between the second collector terminal of the second BJT and the first voltage supply terminal, wherein the second cascode arrangement is configured to receive at least the fixed bias voltage.

3. The amplifier device of claim 2, further comprising:

a non-inverting input terminal configured to receive a second input voltage;

a third BJT having a third emitter terminal, a third collector terminal coupled to a first bias node, and a third base terminal coupled to the non-inverting input terminal; and a third cascode arrangement coupled between the third emitter terminal of the third BJT and the first voltage supply terminal, wherein the third cascode arrangement is configured to receive at least the fixed bias voltage and the variable bias voltage.

4. The amplifier device of claim 3, further comprising:

an inverting input terminal configured to receive a third input voltage;

a fourth BJT having a fourth emitter terminal, a fourth collector terminal coupled to the first bias node, and a fourth base terminal coupled to the inverting input terminal; and a fourth cascode arrangement coupled between the fourth emitter terminal of the fourth BJT and the first voltage supply terminal, wherein the fourth cascode arrangement is configured to receive at least the fixed bias voltage and the variable bias voltage.

5. The amplifier device of claim 4, further comprising:

a third transistor having a third drain terminal electrically coupled to the first bias node, a third source terminal electrically coupled to the third drain terminal, and a third gate terminal that is coupled to the first input terminal; and a fifth cascode arrangement coupled between the third source terminal of the third transistor and the first voltage supply terminal, wherein the fifth cascode arrangement is configured to receive at least the fixed bias voltage and the variable bias voltage.

6. The amplifier device of claim 4, wherein the first input voltage, the third input voltage, and the output voltage are each within 10% of the second input voltage.

7. The amplifier device of claim 4, wherein the second voltage supply terminal is configured to receive a first voltage, the first voltage supply terminal is configured to receive a second voltage, and the first voltage is at least 8 volts higher than the second voltage.

8. The amplifier device of claim 7, wherein the first input voltage, the second input voltage, and the third input voltage, are each greater than the second voltage and less than the first voltage.

9. The amplifier device of claim 3, wherein the first input voltage is configured to track the second input voltage with an offset of between 0 volts to 2 volts.

10. A unity gain buffer comprising:

a first input terminal configured to receive a first input voltage;

a non-inverting input terminal configured to receive a second input voltage, wherein the first input voltage tracks the second input voltage;

a first voltage supply terminal configured to receive a first supply voltage;

an output terminal configured to provide an output voltage; and a first cascode arrangement electrically coupled between the first voltage supply terminal and the output terminal, the first cascode arrangement comprising:

a first transistor coupled to the output terminal and having a first gate terminal that is configured to receive a variable bias voltage, wherein the variable bias voltage corresponds to the first input voltage; and a second transistor coupled between the first transistor and the first voltage supply terminal and having a second gate terminal that is configured to receive a fixed bias voltage, wherein the first transistor is configured to prevent a voltage differential across the second transistor from exceeding a predefined voltage threshold.

11. The unity gain buffer of claim 10, further comprising:

a current supply terminal configured to receive an input current;

a node coupled to the second gate terminal of the second transistor; and a resistance coupled between the current supply terminal and the node, wherein the second gate terminal of the second transistor is configured to receive the fixed bias voltage via the node.

12. The unity gain buffer of claim 10, further comprising:

a second voltage supply terminal configured to receive a second supply voltage that is greater than the first supply voltage; and a voltage divider coupled between the first voltage supply terminal and the second voltage supply terminal, wherein the second gate terminal of the second transistor is configured to receive the fixed bias voltage via a node of the voltage divider.

13. The unity gain buffer of claim 10, further comprising:

a second voltage supply terminal configured to receive a second supply voltage that is greater than the first supply voltage;

a first bipolar junction transistor (BJT) having a first emitter terminal coupled to the second voltage supply terminal, a first collector terminal coupled to the output terminal, and a first base terminal;

a second BJT having a second emitter terminal coupled to the second voltage supply terminal, a second collector terminal, and a second base terminal coupled to the first base terminal of the first BJT; and a second cascode arrangement coupled between the second collector terminal of the second BJT and the first voltage supply terminal, wherein the second cascode arrangement is configured to receive at least the fixed bias voltage.

14. The unity gain buffer of claim 13, further comprising:

a third BJT having a third emitter terminal, a third collector terminal coupled to a first bias node, and a third base terminal coupled to the non-inverting input terminal; and a third cascode arrangement coupled between the third emitter terminal of the third BJT and the first voltage supply terminal, wherein the third cascode arrangement is configured to receive at least the fixed bias voltage and the variable bias voltage.

15. The unity gain buffer of claim 14, further comprising:

an inverting input terminal configured to receive a third input voltage;

a fourth BJT having a fourth emitter terminal, a fourth collector terminal coupled to the first bias node, and a fourth base terminal coupled to the inverting input terminal; and a fourth cascode arrangement coupled between the fourth emitter terminal of the fourth BJT and the first voltage supply terminal, wherein the fourth cascode arrangement is configured to receive at least the fixed bias voltage and the variable bias voltage.

16. The unity gain buffer of claim 15, further comprising:

a third transistor coupled to the first bias node and having a third gate terminal that is coupled to the first input terminal; and a fifth cascode arrangement coupled between the third transistor and the first voltage supply terminal, wherein the fifth cascode arrangement is configured to receive at least the fixed bias voltage and the variable bias voltage.

17. The unity gain buffer of claim 13, wherein the first input voltage is configured to track the second input voltage with an offset of between 0 volts to 2 volts.

18. Control circuitry comprising:

an amplifier transistor configured to receive an RF input signal for amplification;

a reference transistor, wherein the amplifier transistor and the reference transistor are formed on the same semiconductor die;

a switch having an output coupled to a control terminal of the amplifier transistor; and a unity gain buffer comprising:

an input terminal configured to receive a first input voltage;

a non-inverting input terminal coupled to the reference transistor and configured to receive a second input voltage, wherein the first input voltage tracks the second input voltage;

a voltage supply terminal configured to receive a supply voltage;

an output terminal configured to provide an output voltage to the control terminal of the amplifier transistor via the switch; and a cascode arrangement electrically coupled between the voltage supply terminal and the output terminal, the cascode arrangement comprising:

a first transistor coupled to the output terminal and having a first gate terminal that is configured to receive a variable bias voltage, wherein the variable bias voltage corresponds to the first input voltage; and a second transistor coupled between the first transistor and the voltage supply terminal and having a second gate terminal that is configured to receive a fixed bias voltage, wherein the first transistor is configured to prevent a voltage differential across the second transistor from exceeding a predefined voltage threshold.

* * * * *